United States Patent
Kitajima

(10) Patent No.: US 12,215,857 B2
(45) Date of Patent: Feb. 4, 2025

(54) LIGHT EMITTING DEVICE

(71) Applicant: NICHIA CORPORATION, Anan (JP)

(72) Inventor: Tadayuki Kitajima, Itano-gun (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 18/258,880

(22) PCT Filed: Dec. 22, 2021

(86) PCT No.: PCT/JP2021/047608
§ 371 (c)(1),
(2) Date: Jun. 22, 2023

(87) PCT Pub. No.: WO2022/138733
PCT Pub. Date: Jun. 30, 2022

(65) Prior Publication Data
US 2024/0044475 A1  Feb. 8, 2024

(30) Foreign Application Priority Data

Dec. 24, 2020 (JP) .................................. 2020-215688

(51) Int. Cl.
*F21V 7/04* (2006.01)
*F21V 9/30* (2018.01)
*F21Y 113/00* (2016.01)

(52) U.S. Cl.
CPC .................. *F21V 7/04* (2013.01); *F21V 9/30* (2018.02); *F21Y 2113/00* (2013.01)

(58) Field of Classification Search
CPC .......................... F21Y 2115/30; F21Y 2103/10; F21Y 113/00; F21V 13/10; F21V 7/10; F21V 7/04; F21V 9/30
See application file for complete search history.

(56) References Cited

U.S. PATENT DOCUMENTS 5,373,173 A   12/1994  Ohata et al.
6,356,577 B1   3/2002  Miller
(Continued)

FOREIGN PATENT DOCUMENTS

CN        211743673 U   10/2020
JP        H06-104535 A   4/1994
(Continued)

OTHER PUBLICATIONS

International Search Report with English language translation and Written Opinion of the International Searching Authority issued in the corresponding International Patent Application No. PCT/JP2021/047608, dated Mar. 22, 2022.

*Primary Examiner* — William J Carter
(74) *Attorney, Agent, or Firm* — Foley & Lardner LLP

(57) ABSTRACT

A light emitting device includes: a base member including a mounting surface, a first light-emitting element that is disposed on the mounting surface and emits light passing along a first optical axis, a second light-emitting element that is disposed on the mounting surface and emits light passing along a second optical axis, a third light-emitting element that is disposed on the mounting surface and emits light passing along a third optical axis, and one or more light reflective members including a first light reflective surface that includes a first position to be irradiated with the light passing along the first optical axis, a second light reflective surface that includes a second position to be irradiated with the light passing along the second optical axis and, and a third light reflective surface that includes a third position to be irradiated with the light passing along the third optical axis.

14 Claims, 10 Drawing Sheets

(56) References Cited

U.S. PATENT DOCUMENTS

| | | |
|---|---|---|
| 2008/0013584 A1 | 1/2008 | Freund |
| 2008/0019010 A1 | 1/2008 | Govorkov et al. |
| 2015/0229100 A1 | 8/2015 | Sztein et al. |
| 2016/0087399 A1 | 3/2016 | Horn et al. |
| 2016/0186958 A1 | 6/2016 | Nagahara et al. |
| 2019/0234565 A1* | 8/2019 | Kitajima .................. F21V 7/10 |
| 2019/0285248 A1* | 9/2019 | Kamiya ................ F21V 7/0008 |
| 2019/0386192 A1 | 12/2019 | Kozuru et al. |
| 2020/0036158 A1 | 1/2020 | Miyata et al. |

FOREIGN PATENT DOCUMENTS

| | | |
|---|---|---|
| JP | 2000-251308 A | 9/2000 |
| JP | 2001-068794 A | 3/2001 |
| JP | 2001-298236 A | 10/2001 |
| JP | 2003-516553 A | 5/2003 |
| JP | 2004-177707 A | 6/2004 |
| JP | 2005-300954 A | 10/2005 |
| JP | 2008-028391 A | 2/2008 |
| JP | 2014-102288 A | 6/2014 |
| JP | 2015-022955 A | 2/2015 |
| JP | 2015-173213 A | 10/2015 |
| JP | 2016-127022 A | 7/2016 |
| JP | 2017-506824 A | 3/2017 |
| JP | 2018-190805 A | 11/2018 |
| JP | 2019-134017 A | 8/2019 |
| JP | 2019-161062 A | 9/2019 |
| JP | 2019-220672 A | 12/2019 |
| JP | 2020-021761 A | 2/2020 |
| WO | WO-2019/187784 A1 | 10/2019 |

* cited by examiner

LIGHT EMITTING DEVICE

TECHNICAL FIELD

The present disclosure relates to a light emitting device.

BACKGROUND ART

Patent Document 1 discloses a light source device in which light beams emitted from a plurality of light-emitting elements are reflected by a reflective surface of a rising mirror and are output to the outside. In this light source device, the plurality of light-emitting elements are juxtaposed on the same side with respect to the rising mirror.

CITATION LIST

Patent Document

Patent Document 1: JP 2020-21761 A

SUMMARY OF INVENTION

Technical Problem

Each of the plurality of light-emitting elements is considered to be a heat source. Therefore, when the plurality of light-emitting elements are disposed close to each other, the heat sources come close to each other. Depending on the temperature characteristics of the light-emitting element and required light output, the heat sources may be preferably separated.

Solution to Problem

A light emitting device according to a certain embodiment of the present disclosure includes a base member including a mounting surface, a first light-emitting element that is disposed on the mounting surface and emits light passing along a first optical axis, a second light-emitting element that is disposed on the mounting surface and emits light passing along a second optical axis, a third light-emitting element that is disposed on the mounting surface and emits light passing along a third optical axis, and one or more light reflective members including a first light reflective surface that includes a first position to be irradiated with the light passing along the first optical axis and is inclined relative to the mounting surface, a second light reflective surface that includes a second position to be irradiated with the light passing along the second optical axis and is inclined relative to the mounting surface, and a third light reflective surface that includes a third position to be irradiated with the light passing along the third optical axis and is inclined relative to the mounting surface. In a top view, when the mounting surface is divided into a first region and a second region by a virtual first straight line passing through the second position and the third position as a boundary, the first light-emitting element is disposed in the first region, and the second light-emitting element and the third light-emitting element are disposed in the second region. In the top view, the second light reflective surface and the third light reflective surface sandwich the first light reflective surface.

Advantageous Effects of Invention

One embodiment of the present disclosure can provide a light emitting device in which a plurality of light-emitting elements serving as heat sources are disposed in a distributed manner.

DESCRIPTION OF EMBODIMENTS

Figure 1:
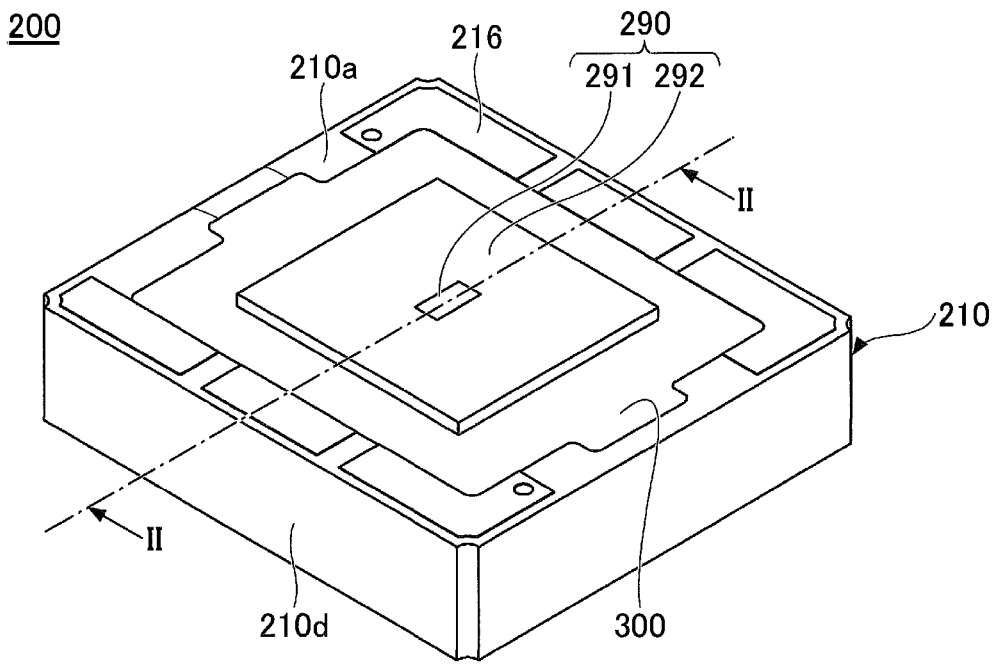
FIG. 1 is a perspective view illustrating a light emitting device according to the present embodiment.

Hereinafter, embodiments for carrying out the invention are described with reference to the drawings. In the following description, terms indicating a specific direction or position (for example, "upper", "lower", and other terms including those terms) are used, as necessary. The use of those terms; however, is to facilitate understanding of the invention with reference to the drawings, and the technical scope of the present invention is not limited by the meaning of those terms. In addition, parts having the same reference numerals or signs appearing in a plurality of drawings indicate identical or equivalent parts or members.

In the present disclosure, polygons such as triangles and quadrangles, including shapes in which the corners of the polygon are rounded, chamfered, beveled, coved, and the like, are referred to as polygons. Furthermore, a shape obtained by processing not only the corners (ends of sides), but also an intermediate portion of a side is similarly referred to as a polygon. That is, a shape that is partially processed while leaving the polygon as the base is included in the interpretation of the "polygon" described in the present disclosure.

The same applies not only to polygons, but also to words representing specific shapes such as trapezoids, circles, protrusions, and recessions. The same applies when dealing with each side forming that shape. That is, even when processing is performed on a corner or an intermediate portion of a certain side, the interpretation of "side" includes the processed portion. When a "polygon" or a "side" not partially processed is to be distinguished from a processed shape, a word "strict" is added to the description as in, for example, "strict quadrangle".

Furthermore, the following embodiments exemplify light emitting devices and the like for embodying the technical concept of the present invention, and the present invention is not limited to the description below. In addition, unless otherwise specified, the dimensions, materials, shapes, relative arrangements, and the like of constituent elements described below are not intended to limit the scope of the present invention to those alone but are intended to be exemplified. The contents described in one embodiment can be applied to other embodiments and variations. The size, positional relationship, and the like of the members illustrated in the drawings can be exaggerated in order to clarify the explanation. Furthermore, in order to avoid excessive complication of the drawings, a schematic view in which some elements are not illustrated may be used, or an end view illustrating only a cutting surface may be used as a cross-sectional view.

Embodiment

Figure 2:
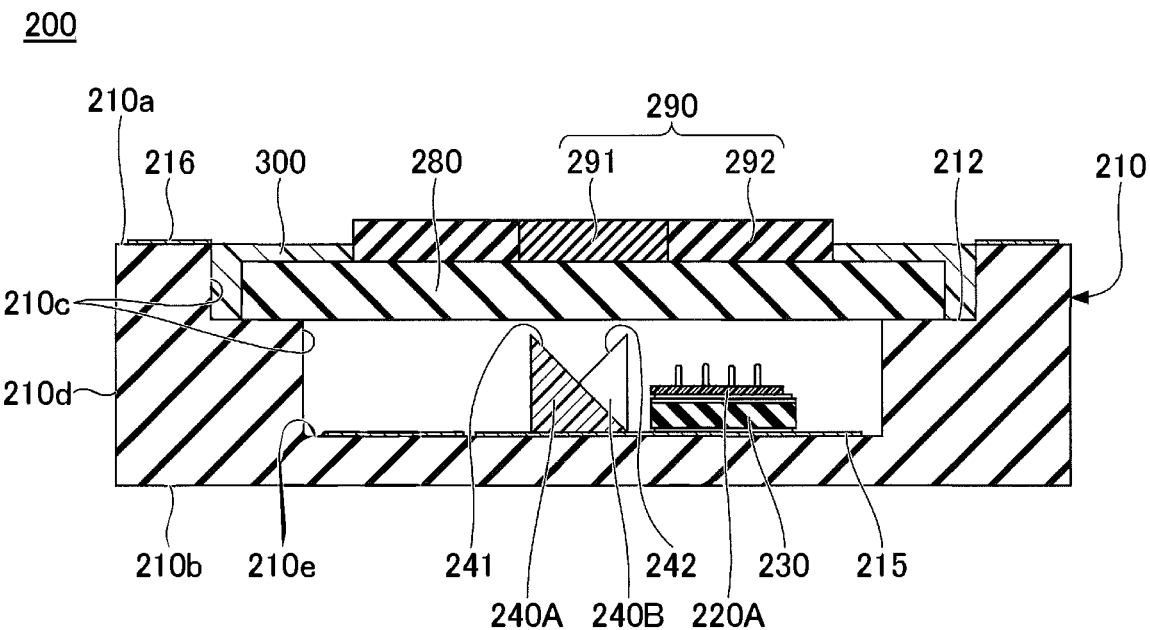
FIG. 2 is a cross-sectional view taken along line II-II in FIG. 1, illustrating the light emitting device according to the present embodiment.
Figure 3:
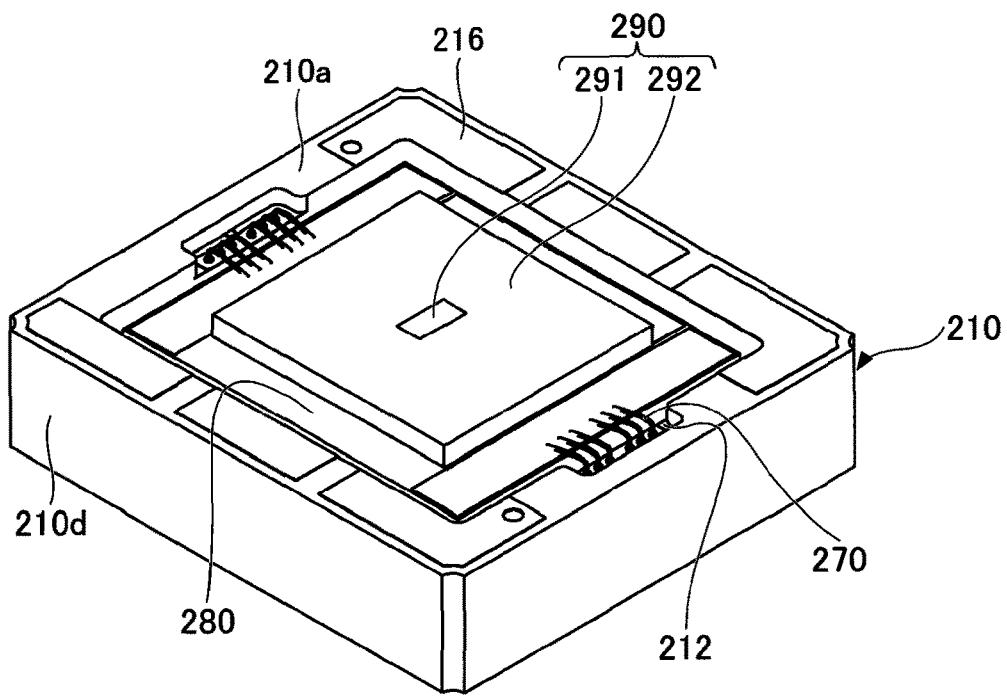
FIG. 3 is a perspective view illustrating an internal structure of the light emitting device according to the present embodiment.
Figure 4:
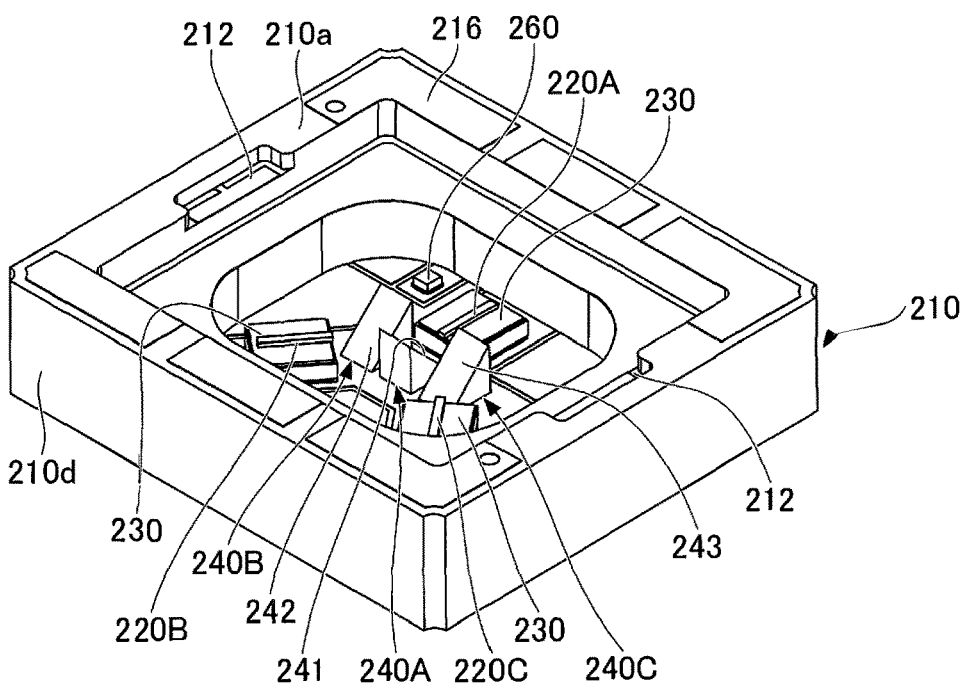
FIG. 4 is a perspective view of the light emitting device according to the present embodiment from which a wavelength conversion member and a sealing member are removed.
Figure 5:
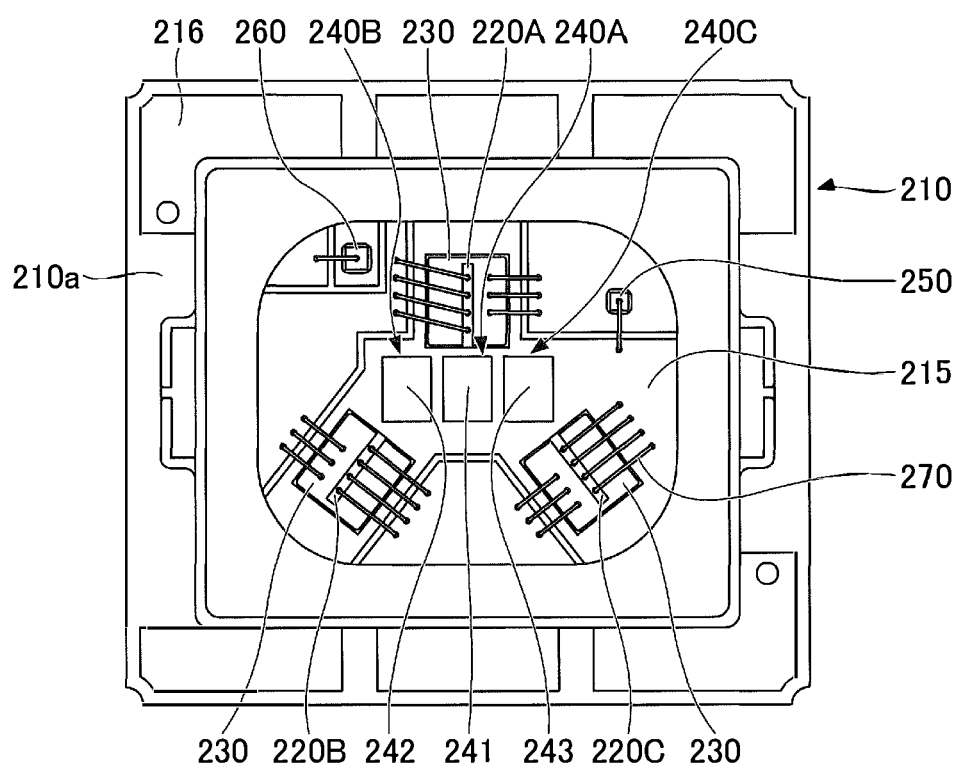
FIG. 5 is a top view of the light emitting device according to the present embodiment from which the wavelength conversion member and the sealing member are removed.

FIG. 1 is a perspective view illustrating a light emitting device according to the present embodiment. FIG. 2 is a cross-sectional view taken along line II-II in FIG. 1, illustrating the light emitting device according to the present embodiment. FIG. 3 is a perspective view illustrating an internal structure of the light emitting device according to the present embodiment. FIG. 4 is a perspective view of the light emitting device according to the present embodiment from which a wavelength conversion member and a sealing member are removed. FIG. 5 is a top view of the light emitting device according to the present embodiment from which the wavelength conversion member and the sealing member are removed. FIG. 4 does not illustrate a wiring line 270.

A light emitting device 200 according to the present embodiment has a plurality of components. The plurality of components include a base member 210, a first light-emitting element 220A, a second light-emitting element 220B, a third light-emitting element 220C, one or a plurality of submounts 230, one or a plurality of light reflective members, a protective element 250, a temperature measuring element 260, the wiring line 270, a sealing member 280, a wavelength conversion member 290, and a light shielding member 300. The light emitting device 200 may not include all of these components. For example, the present embodiment can implement the light emitting device 200 including a plurality of components including at least the base member 210, the first light-emitting element 220A, the second light-emitting element 220B, the third light-emitting element 220C, and one or more light reflective members each including three light reflective surfaces.

As illustrated in FIGS. 1 to 5, the light emitting device 200 illustrated by the drawings includes the base member 210, the first light-emitting element 220A, the second light-emitting element 220B, the third light-emitting element 220C, the submounts 230 corresponding to each of the light-emitting elements, a plurality of light reflective members including a first light reflective member 240A, a second light reflective member 240B, and a third light reflective member 240C, the protective element 250, the temperature measuring element 260, the wiring lines 270, the sealing member 280, the wavelength conversion member 290, and the light shielding member 300.

Each component of the light emitting device 200 will be described.

Base Member 210

The base member 210 includes an upper surface 210a, a lower surface 210b, one or a plurality of inner lateral surfaces 210c, one or a plurality of outer lateral surfaces 210d, and a bottom surface 210e. The bottom surface 210e is a mounting surface on which other components are disposed. The base member 210 has a recessed shape recessed in the direction from the upper surface 210a to the lower surface 210b. The base member 210 has a rectangular outer shape in a top view, and the recess is defined inside the outer shape.

In the top view, a frame is formed by the one or the plurality of inner lateral surfaces 210c meeting the upper surface 210a. That is, the base member 210 includes the bottom surface 210e and the frame forming the inner lateral surface 210c extending above the bottom surface 210e. The recess of the base member 210 is surrounded by the bottom surface 210e and the frame.

The top view refers to viewing an object along the normal direction of the upper surface 210a of the base member 210. The shape of the object viewed along the normal direction of the upper surface 210a of the base member 210 may be referred to as a planar shape.

The base member 210 includes one or a plurality of step portions 212 inside the frame. The step portion 212 includes only an upper surface and a lateral surface meeting the upper surface and proceeding downward. The one or the plurality of inner lateral surfaces 210c include a lateral surface meeting the upper surface 210a of the base member 210 and the lateral surface of the step portion 212.

The base member 210 can be made of, for example, a ceramic as a main material. For example, aluminum nitride, silicon nitride, aluminum oxide, or silicon carbide can be used as the ceramic. The base member 210 is not limited to a ceramic and may be formed by using other materials having insulating properties as a main material.

The bottom surface 210e of the base member 210 is provided with one or a plurality of metal films 215. The upper surface 210a of the base member 210 is provided with one or a plurality of metal films 216. The one or more metal films 215 provided on the bottom surface 210e include the metal film electrically connected to the metal film 216 provided on the upper surface 210a. For example, the metal film 215 provided on the bottom surface 210e and the metal film 216 provided on the upper surface 210a are electrically connected via a metal material provided in a via hole. As the metal films 215 and 216, Ni/Au (metal film in which Ni and Au are layered in this order), Ti/Pt/Au (metal film in which Ti, Pt and Au are layered in this order), or the like can be used, for example.

First Light-Emitting Element 220A, Second Light-Emitting Element 220B, and Third Light-Emitting Element 220C

The first light-emitting element 220A, the second light-emitting element 220B, and the third light-emitting element 220C are, for example, semiconductor laser elements. The first light-emitting element 220A, the second light-emitting element 220B, and the third light-emitting element 220C are not limited to the semiconductor laser elements, and may be, for example, light-emitting diodes (LEDs), organic light-emitting diodes (OLED), or the like.

In the example of the light emitting device 200 illustrated by the drawings, semiconductor laser elements are employed as the first light-emitting element 220A, the second light-emitting element 220B, and the third light-emitting element 220C. The first light-emitting element 220A, the second light-emitting element 220B, and the third light-emitting element 220C are simply referred to as a light-emitting element 220 unless otherwise distinguished. The light-emitting element 220 refers to the first light-emitting element 220A, the second light-emitting element 220B, or the third light-emitting element 220C in the light emitting device 200 illustrated by the drawings. The light emitting device 200 may further include one or more light-emitting elements in addition to the three light-emitting elements 220.

The light-emitting element 220 has, for example, a rectangular outer shape in the top view. A lateral surface meeting one of two short sides of the rectangle serves as a light-emitting surface for light emitted from the light-emitting element 220. An upper surface and a lower surface of the light-emitting element 220 each have a larger area than that of the light-emitting surface.

A case in which the light-emitting element 220 is a semiconductor laser element will be described below. Light (laser light) emitted from the light-emitting element 220 spreads and forms an elliptical far field pattern (hereinafter, referred to as "FFP") on a plane parallel to the light-emitting surface. The FFP indicates a shape and a light intensity distribution of emitted light at a position away from the light-emitting surface.

Based on the light having elliptical shape emitted from the light-emitting element 220, a direction passing along the major axis of the elliptical shape is referred to as a fast axis direction of the FFP, and a direction passing along the minor axis of the elliptical shape is referred to as a slow axis direction of the FFP. The fast axis direction of the FFP in the light-emitting element 220 can coincide with a layering direction in which a plurality of semiconductor layers including an active layer of the light-emitting element 220 are layered.

Based on the light intensity distribution of the FFP of the light-emitting element 220, light having an intensity of $1/e^2$ times or greater of a peak intensity value is referred to as a main part of light. In this light intensity distribution, an angle corresponding to the intensity of $1/e^2$ is referred to as a divergence angle. The divergence angle of the FFP in the fast axis direction is greater than the divergence angle of the FFP in the slow axis direction.

Light passing through the center of the elliptical shape of the FFP, in other words, light having a peak intensity in the light intensity distribution of the FFP, is referred to as light traveling along an optical axis or light passing along an optical axis. The optical path of the light traveling along the optical axis is referred to as the optical axis of the light.

As the light-emitting element 220, a light-emitting element in which a light emission peak wavelength of light emitted from the light-emitting element 220 is in a range from 320 nm to 530 nm, typically in a range from 430 nm to 480 nm can be used. Examples of such a light-emitting element 220 include a semiconductor laser element including a nitride semiconductor. As the nitride semiconductor, for example, GaN, InGaN, or AlGaN can be used.

The light emission peak of the light emitted from the light-emitting element 220 may not limited to the above. The light-emitting element 220 may emit light having a wavelength out of the wavelength range described here. For example, light emitted from the light-emitting element 220 can be appropriately determined within the range of visible light. The light emission peak wavelengths of light beams emitted from the first light-emitting element 220A, light emitted from the second light-emitting element 220B, and light emitted from the third light-emitting element 220C are, for example, the same. The same described here includes a case in which the difference between light emission peak wavelengths is equal to or less than 10 nm.

However, the light emission peak wavelengths of light beams emitted from the first light-emitting element 220A, light emitted from the second light-emitting element 220B, and light emitted from the third light-emitting element 220C may not be the same. For example, the first light-emitting element 220A may have a light emission peak wavelength corresponding to red light, the second light-emitting element 220B may have a light emission peak wavelength corresponding to green light, and the third light-emitting element 220C may have a light emission peak wavelength corresponding to blue light.

Submount 230

The submount 230 is configured to have, for example, a rectangular parallelepiped shape and includes a lower surface, an upper surface, and one or a plurality of lateral surfaces. The submount 230 has the smallest width in the vertical direction. The shape may not be limited to a rectangular parallelepiped. The submount 230 is formed by using, for example, aluminum nitride or silicon carbide, but other materials may be used. A metal film, for example, is provided on the upper surface of the submount 230.

First Light Reflective Member 240A, Second Light Reflective Member 240B, and Third Light Reflective Member 240C The first light reflective member 240A, the second light reflective member 240B, and the third light reflective member 240C each include a lower surface, a plurality of lateral surfaces, and a light reflective surface inclined relative to the lower surface. The plurality of lateral surfaces include two lateral surfaces opposing each other with the light reflective surface interposed therebetween. The light reflective surface provided on the first light reflective member 240A will be referred to as a first light reflective surface 241, the light reflective surface provided on the second light reflective member 240B will be referred to as a second light reflective surface 242, and the light reflective surface provided on the third light reflective member 240C will be referred to as a third light reflective surface 243. The first light reflective surface 241, the second light reflective surface 242, and the third light reflective surface 243 each have a light reflectance of 90% or more with respect to the peak wavelength of emitted light. The light reflectance may be equal to or less than 100% or may be less than 100%.

The first light reflective surface 241, the second light reflective surface 242, and the third light reflective surface 243 are, for example, planes. The inclination angle of each of the first light reflective surface 241, the second light reflective surface 242, and the third light reflective surface 243 relative to the lower surface of the corresponding one of the light reflective members is in a range from 10° to 80°. The first light reflective surface 241, the second light reflective surface 242, and the third light reflective surface 243 may not be planes, and may be, for example, curved surfaces.

In the examples of the first light reflective member 240A, the second light reflective member 240B, and the third light reflective member 240C illustrated by the drawings, the inclination angle of each of the first light reflective surface 241, the second light reflective surface 242, and the third light reflective surface 243 relative to the lower surface of the corresponding one of the light reflective members is 45°. When specific angles of the inclination angles are described, a tolerance of ±5° from the specific angle is allowed for manufactured products in consideration of manufacturing accuracy.

For the first light reflective member 240A, the second light reflective member 240B, and the third light reflective member 240C, glass, metal, or the like can be used as a main material for forming the outer shapes thereof. The main material is preferably a heat-resistant material, and, for example, glass such as quartz and BK7 (borosilicate glass), metal such as aluminum, or Si can be used. Alternatively, the first light reflective surface 241, the second light reflective surface 242, and the third light reflective surface 243 can be formed by using, for example, metal such as Ag and Al, or a dielectric multilayer such as $Ta_2O_5/SiO_2$, $TiO_2/SiO_2$, and $Nb_2O_5/SiO_2$.

Protective Element 250

The protective element 250 is used for suppressing a specific element such as a semiconductor laser element from being broken by an excessive current flowing therethrough. For example, a Zener diode made of Si can be used as the protective element 250.

Temperature Measuring Element 260

The temperature measuring element 260 is an element used as a temperature sensor for measuring the ambient temperature. For example, a thermistor can be used as the temperature measuring element 260.

Wiring Line 270

The wiring line 270 is formed from a conductor having a linear shape with bonding portions at both ends. In other words, the wiring line 270 includes the bonding portions that are to be bonded to other components, at both ends of the linear portion. The wiring line 270 is used for electrical connection between two components. For example, a metal wire can be used as the wiring line 270. Examples of the metal include gold, aluminum, silver, copper, and the like.

Sealing Member 280

The sealing member 280 is a light transmissive member. The sealing member 280 includes an upper surface, a lower surface that is an opposite surface of the upper surface, and one or a plurality of lateral surfaces meeting the upper surface and the lower surface. The lateral surface connects an outer edge of the upper surface and an outer edge of the lower surface. The sealing member 280 is, for example, a rectangular parallelepiped or a cube. In this case, both the upper surface and the lower surface of the sealing member 280 have a rectangular shape, and the sealing member 280 has four rectangular lateral surfaces.

However, the sealing member 280 is not limited to a rectangular parallelepiped or a cube. That is, the planar shape of the sealing member 280 is not limited to a rectangle and can be any shape such as a circle, an ellipse, and a polygon.

The sealing member 280 includes a base material formed in a flat plate shape such as a rectangular parallelepiped. The base material of the sealing member 280 can be formed by using, for example, sapphire as a main material. The sapphire is a material with relatively high transmittance and relatively high strength. In addition to the sapphire, for example, a light transmissive material including quartz, silicon carbide, or glass may be used as the main material.

Wavelength Conversion Member 290

The wavelength conversion member 290 includes a wavelength conversion portion 291 and a light reflective portion 292. The wavelength conversion portion 291 includes an upper surface, a lower surface that is an opposite surface of the upper surface, and one or a plurality of lateral surfaces meeting the upper surface and the lower surface. The one or the plurality of lateral surfaces connect an outer edge of the upper surface and an outer edge of the lower surface. The wavelength conversion portion 291 is, for example, a rectangular parallelepiped or a cube. In this case, both the upper surface and the lower surface of the wavelength conversion portion 291 have a rectangular shape, and the wavelength conversion portion 291 includes four rectangular lateral surfaces. The rectangular shape described here refers to a rectangle or a square.

However, the wavelength conversion portion 291 is not limited to a rectangular parallelepiped or a cube. That is, the planar shape of the wavelength conversion portion 291 is not limited to a rectangle, and can be any shape such as a circle, an ellipse, and a polygon.

The wavelength conversion portion 291 can convert light incident on the lower surface into light having a different wavelength and emit the converted light from the upper surface. The wavelength conversion portion 291 may cause a part of the incident light to exit. The wavelength conversion portion 291 may convert all the incident light into light having a different wavelength. In this case, the light entering the wavelength conversion portion 291 is not caused to exit from the wavelength conversion portion 291. The wavelength conversion portion 291 can be formed by containing a phosphor in the main material.

Because the wavelength conversion portion 291 is irradiated with light, a base material of the wavelength conversion portion 291 is preferably formed by using, as the main material, an inorganic material that is not easily decomposed by irradiation of the light. The main material is, for example, a ceramic. Examples of the ceramic used for the main material include aluminum oxide, aluminum nitride, silicon oxide, yttrium oxide, zirconium oxide, and magnesium oxide. The main material of the ceramic is preferably selected from a material having a melting point in a range from 1300° C. to 2500° C. so that deterioration such as deformation or discoloration due to heat is not generated in the wavelength conversion portion 291. The wavelength conversion portion 291 is, for example, a sintered compact formed by using a ceramic as the main material.

The wavelength conversion portion 291 can be formed by sintering, for example, a phosphor and a light transmissive material such as aluminum oxide. The content of the phosphor can be in a range from 0.05 vol % to 50 vol % with respect to the total volume of the ceramic. For example, a ceramic substantially including only a phosphor, which is obtained by sintering the powder of the phosphor, may be used. The wavelength conversion portion 291 may be made of a single crystal of the phosphor.

Examples of the phosphor include cerium-activated yttrium aluminum garnet (YAG), cerium-activated lutetium aluminum garnet (LAG), europium-activated silicate ((Sr, Ba)$_2$SiO$_4$), α-SiAlON phosphor, and β-SiAlON phosphor. Among them, the YAG phosphor has good heat resistance.

For example, in a case in which the wavelength conversion portion 291 includes the YAG phosphor, the wavelength conversion portion 291 can emit white light from the upper surface by combining the blue excitation light and yellow fluorescence upon incidence of blue excitation light on the lower surface.

The light reflective portion 292 is, for example, a frame-shaped member including a rectangular opening. The light reflective portion 292 includes an upper surface, a lower surface that is an opposite surface of the upper surface, one or a plurality of inner lateral surfaces connecting an inner edge of the upper surface and an inner edge of the lower surface, and one or a plurality of outer lateral surfaces connecting an outer edge of the upper surface and an outer edge of the lower surface. The outer edge and the inner edge of the upper surface, and the outer edge and the inner edge of the lower surface are rectangular, for example. In this case, the light reflective portion 292 includes four rectangular inner lateral surfaces and four rectangular outer lateral surfaces. However, the outer edge and the inner edge of the upper surface, and the outer edge and the inner edge of the lower surface are not limited to the rectangular shape, and can be any shape such as a circle, an ellipse, and a polygon.

The light reflective portion 292 is, for example, a sintered compact formed by using a ceramic as a main material. Examples of the ceramic used for the main material include aluminum oxide, aluminum nitride, silicon oxide, yttrium oxide, zirconium oxide, and magnesium oxide. Among them, aluminum oxide is preferable from the perspective of high reflectivity. The light reflective portion 292 may not use a ceramic as the main material. The light reflective portion 292 may be formed by using, for example, metal, a composite of a ceramic and metal, or the like.

In the wavelength conversion member 290, the inner lateral surface of the light reflective portion 292 is connected to the lateral surface of the wavelength conversion portion 291. The wavelength conversion member 290 has a flat plate shape and is, for example, a rectangular parallelepiped.

The upper surface of the wavelength conversion portion 291 and the upper surface of the light reflective portion 292 may form, for example, one continuous plane. The lower surface of the wavelength conversion portion 291 and the lower surface of the light reflective portion 292 may form, for example, one continuous plane. The upper surface and/or the lower surface of the wavelength conversion portion 291 may have a shape protruding from the upper surface and/or the lower surface of the light reflective portion 292, respectively. In this case, a part of the lateral surface of the wavelength conversion portion 291 is connected to the inner lateral surface of the light reflective portion 292.

By integrally forming the wavelength conversion portion 291 and the light reflective portion 292, the wavelength conversion member 290 can be formed. By separately forming the wavelength conversion portion 291 and the light reflective portion 292 and bonding them together, the wavelength conversion member 290 may be formed. The wavelength conversion portion 291 and the light reflective portion 292 are integrally formed by a sintered compact, for example. For example, by forming the sintered compact of the wavelength conversion portion 291 and then forming the sintered compact of the light reflective portion 292 integrally with the wavelength conversion portion 291, an integrated sintered compact can be formed. In this case, in each of the step of forming the wavelength conversion portion 291 and the step of forming the light reflective portion 292, the ratio of voids (porosity) included in the sintered compact to be formed can also be adjusted. The porosity can be adjusted by sintering conditions (sintering temperature, sintering time, and rate of temperature increase), particle size of materials, concentration of sintering aids, and the like.

For example, when the wavelength conversion portion 291 and the light reflective portion 292 are formed by using the same ceramic as the main material, the porosity of the light reflective portion 292 is made greater than the porosity of the wavelength conversion portion 291. That is, the wavelength conversion member 290 is formed so that the light reflective portion 292 includes more voids than the wavelength conversion portion 291. In this case, the sintering conditions are preferably adjusted so that the porosity of the light reflective portion 292 is approximately 10%. Thus, a reflective region can be formed by air at the boundary between the lateral surface of the wavelength conversion portion 291 and the inner lateral surface of the light reflective portion 292, and light striking the inner lateral surface of the light reflective portion 292 from the wavelength conversion portion 291 can be reflected toward the wavelength conversion portion 291.

Light Shielding Member 300

The light shielding member 300 is made of resin having light shielding properties. The light shielding properties indicate properties of transmitting no light and may be achieved by using light absorbing properties, light reflective properties, or the like, in addition to the light shielding properties. The light shielding member 300 can be formed, for example, by containing a filler such as a light diffusing material and/or a light absorbing material in resin.

Examples of the resin for forming the light shielding member 300 include epoxy resin, silicone resin, acrylate resin, urethane resin, phenol resin, and BT resin. Examples of the light absorbing filler include dark-colored pigments such as carbon black.

Light Emitting Device 200

In the light emitting device 200, one or more light reflective members are disposed on the mounting surface of the base member 210. The one or more light reflective members each include the first light reflective surface 241, the second light reflective surface 242, and the third light reflective surface 243. That is, in the light emitting device 200, one light reflective member may include the first light reflective surface 241, the second light reflective surface 242, and the third light reflective surface 243. The first light reflective surface 241, the second light reflective surface 242, and the third light reflective surface 243 may be configured by a plurality of light reflective members.

In the example of the light emitting device 200 illustrated by the drawings, the first light reflective member 240A, the second light reflective member 240B, and the third light reflective member 240C are disposed on the mounting surface of the base member 210. The first light reflective member 240A, the second light reflective member 240B, and the third light reflective member 240C are arranged side by side. The second light reflective member 240B, the first light reflective member 240A, and the third light reflective member 240C are arranged in this order, but the arrangement order is not limited to this order. The first light reflective member 240A, the second light reflective member 240B, and the third light reflective member 240C are disposed in the central region of the mounting surface in the top view.

In the top view, the direction in which the first light reflective member 240A, the second light reflective member 240B, and the third light reflective member 240C are arranged is referred to as a first direction, and a direction perpendicular to the first direction is referred to as a second direction. A specific example of a state in which a certain object is disposed in the central region of the mounting surface in the top view may include, when the mounting surface is divided into three equal regions in the second direction by a virtual line parallel to the first direction in the top view, a state in which the object is disposed in a middle region of the three equal regions.

The distance from a lateral surface not facing the first light reflective member 240A out of two lateral surfaces of the second light reflective member 240B opposing each other with the second light reflective surface 242 interposed therebetween to a lateral surface not facing the first light reflective member 240A out of two lateral surfaces of the third light reflective member 240C opposing each other with the third light reflective surface 243 interposed therebetween is preferably in a range from 30% to 60% of the length of the bottom surface 210e of the base member in the first direction. Setting the distance within this range can contribute to miniaturization of the light emitting device 200.

In the top view, the second light reflective surface 242 and the third light reflective surface 243 sandwich the first light reflective surface 241. In the example of the present embodiment, because each light reflective member includes one light reflective surface, the second light reflective member 240B and the third light reflective member 240C sandwich the first light reflective member 240A in the top view. In the top view, the first light reflective surface 241, the second light reflective surface 242, and the third light reflective surface 243 are disposed, for example, so that the longer directions thereof are directed to the same direction.

The second light reflective surface 242 and the third light reflective surface 243 are parallel to each other. The first light reflective surface 241 is not parallel to the second light reflective surface 242 and the third light reflective surface 243. The parallel described here includes a tolerance of ±5°. The second light reflective surface 242 and the third light reflective surface 243 are located on a virtual first plane, and the first light reflective surface 241 is located on a virtual second plane not coplanar with the first plane. For example, when the first light reflective member 240A is rotated 180° in the plane direction about the center of the first light reflective member 240A in the top view, the first light reflective surface 241 becomes parallel to the first plane, or alternatively is located on the first plane.

The inclination angle of the first light reflective surface 241 relative to the mounting surface of the base member 210 is the same as the inclination angle of the first light reflective surface 241 relative to the lower surface of the first light reflective member 240A. The inclination angle of the second light reflective surface 242 relative to the mounting surface of the base member 210 is the same as the inclination angle of the second light reflective surface 242 relative to the lower surface of the second light reflective member 240B. The inclination angle of the third light reflective surface 243 relative to the mounting surface of the base member 210 is the same as the inclination angle of the third light reflective surface 243 relative to the lower surface of the third light reflective member 240C. The same described here includes a tolerance of ±2°.

In the base member 210, the submounts 230 are disposed on the mounting surface. The submount 230 is provided for each of the light-emitting elements. That is, at least the same number of submounts 230 as the number of light-emitting elements included in the light emitting device 200 are disposed on the mounting surface. In the light emitting device 200 illustrated by the drawings, a plurality of submounts 230 are disposed, more specifically, three submounts 230 are disposed. The lower surface of the submount 230 is bonded to an upper surface of the metal film 215 formed on the mounting surface of the base member 210, for example.

The submount 230 is disposed corresponding to each light reflective surface. The submount 230 corresponding to the first light reflective surface 241 has a lateral surface facing the first light reflective surface 241. A virtual line, which passes through one end of a side where the lateral surface and the upper surface of the submount meet each other and is parallel to the second direction, passes through the second light reflective surface 242 in the top view. A virtual line, which passes through the other end of the side and is parallel to the second direction, passes through the third light reflective surface 243 in the top view. Thus, the submount 230 having a size that exhibits sufficient heat dissipation effects can be disposed while the respective light reflective surfaces are disposed close to one another, which can contribute to the miniaturization of the light emitting device 200 and improvement in the quality of light.

The submount 230 corresponding to the second light reflective surface 242 has a lateral surface facing the second light reflective surface 242. This lateral surface obliquely faces the second light reflective surface 242. A virtual line, which passes through one end close to the third light reflective surface 243 out of both ends of a side where this lateral surface and the upper surface of the submount 230 meet each other and is parallel to the second direction, passes through the second light reflective surface 242 in the top view. A virtual line, which passes through the other end of both ends of the side and is parallel to the first direction, passes through the second light reflective surface 242 in the top view. This virtual line also passes through the first light reflective surface 241 and the third light reflective surface 243. Both the two virtual lines, which are parallel to the second direction and respectively pass through both ends of a side where a lateral surface opposite to the lateral surface facing the second light reflective surface 242 and the upper surface of the submount 230 meet each other, do not pass through the second light reflective surface 242 in the top view.

The submount 230 corresponding to the third light reflective surface 243 has a lateral surface facing the third light reflective surface 243. This lateral surface obliquely faces the third light reflective surface 243. A virtual line, which passes through one end close to the second light reflective surface 242 out of both ends of a side where this lateral surface and the upper surface of the submount 230 meet each other and is parallel to the second direction, passes through the third light reflective surface 243 in the top view. A virtual line, which passes through the other end of both ends of the side and is parallel to the first direction, passes through the third light reflective surface 243 in the top view. This virtual line also passes through the first light reflective surface 241 and the second light reflective surface 242. Both the two virtual lines, which are parallel to the second direction and respectively pass through both ends of a side where a lateral surface opposite to the lateral surface facing the third light reflective surface 243 and the upper surface of the submount 230 meet each other, do not pass through the second light reflective surface 242 in the top view. Thus, the submount 230 corresponding to the second light reflective surface 242 and the submount 230 corresponding to the third light reflective surface 243 can also contribute to the miniaturization of the light emitting device 200 and improvement in the quality of light, as in the submount 230 corresponding to the first light reflective surface 241.

Regarding areas of the upper surfaces of the submounts corresponding to the respective light-emitting elements, a maximum area is a magnification in a range from 1.0 times to 2.0 times a minimum area. When this magnification is 1.0 times, the areas of the upper surfaces of the submounts corresponding to the respective light-emitting elements are equal. The equal described here includes a tolerance in a range from 0% to +5%.

In the light emitting device 200, the first light-emitting element 220A, the second light-emitting element 220B, and the third light-emitting element 220C are disposed on the mounting surface of the base member 210. The first light-emitting element 220A, the second light-emitting element 220B, and the third light-emitting element 220C are each disposed on the mounting surface via the submount 230.

The first light-emitting element 220A includes a light-emitting surface facing toward the first light reflective surface 241. The light-emitting surface of the first light-emitting element 220A is, for example, parallel or perpendicular to the inner lateral surface 210c or the outer lateral surface 210d of the base member 210. The second light-emitting element 220B includes a light-emitting surface facing toward the second light reflective surface 242. The third light-emitting element 220C includes a light-emitting surface facing toward the third light reflective surface 243. The light-emitting surfaces of the second light-emitting element 220B and the third light-emitting element 220C are, for example, not parallel or perpendicular to the inner lateral surface 210c or the outer lateral surface 210d of the base member 210. That is, the second light-emitting element 220B and the third light-emitting element 220C are disposed, for example, so that the light-emitting surfaces are oblique to the inner lateral surface 210c and the outer lateral surface 210d of the base member 210 in the top view.

The first light reflective surface 241 is irradiated with light emitted from the light-emitting surface of the first light-emitting element 220A. The second light reflective surface 242 is irradiated with light emitted from the light-emitting surface of the second light-emitting element 220B. The third light reflective surface 243 is irradiated with light emitted from the light-emitting surface of the third light-emitting element 220C.

The positional relationship between the plurality of light-emitting elements 220 shows that the light-emitting surfaces of two light-emitting elements 220, which are optionally selected from the plurality of light-emitting elements 220, are disposed so that one of the two light-emitting surfaces is oblique to the other of the two light-emitting surfaces, in the top view. By making the light-emitting surface oblique, light beams emitted from the light-emitting elements 220 to corresponding light reflective surfaces can be brought closer to each other.

Figure 6:
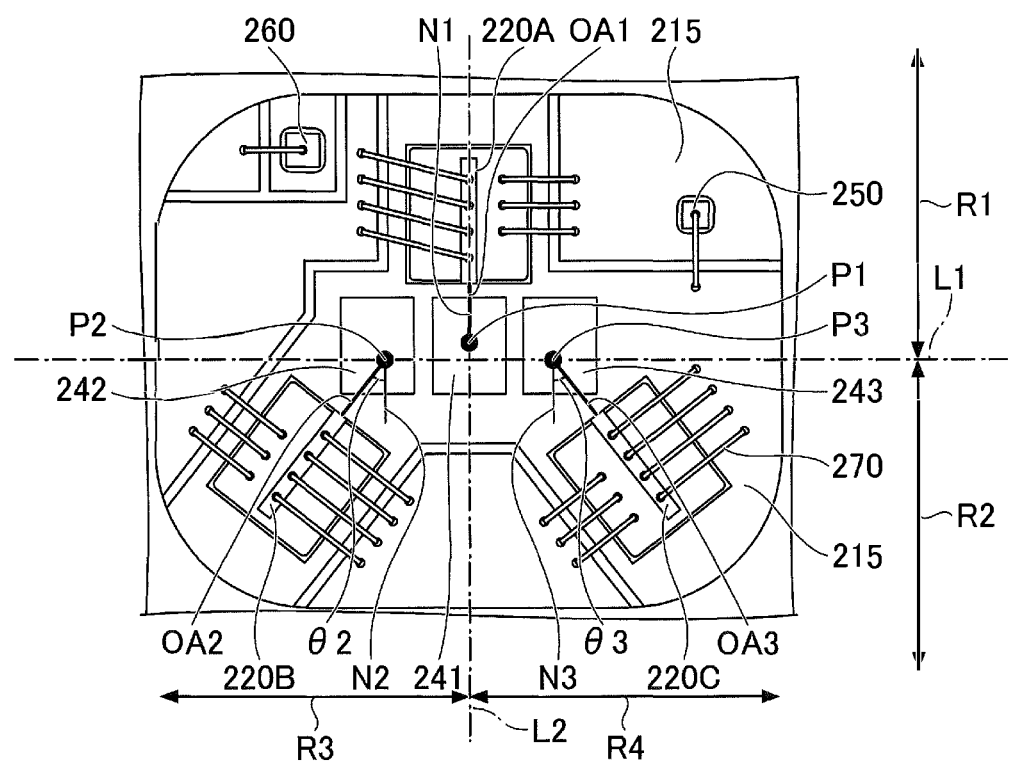
FIG. 6 is a partially enlarged top view (part 1) of the light emitting device according to the present embodiment from which the wavelength conversion member and the sealing member are removed.

In FIG. 6, an optical axis of light emitted from the light-emitting surface of the first light-emitting element 220A is illustrated as a first optical axis OA1, an optical axis of light emitted from the light-emitting surface of the second light-emitting element 220B is illustrated as a second optical axis OA2, and an optical axis of light emitted from the light-emitting surface of the third light-emitting element 220C is illustrated as a third optical axis OA3. A position of the first light reflective surface 241 irradiated with light passing along the first optical axis OA1 is illustrated as a first position P1, a position of the second light reflective surface 242 irradiated with light passing along the second optical axis OA2 is illustrated as a second position P2, and a position of the third light reflective surface 243 irradiated with light passing along the third optical axis OA3 is illustrated as a third position P3.

In the top view, regions of the mounting surface divided into two by a virtual first straight line L1 passing through the second position P2 and the third position P3 are referred to as a first region R1 and a second region R2. In such a case, the first light-emitting element 220A is disposed in the first region R1, and the second light-emitting element 220B and the third light-emitting element 220C are disposed in the second region R2. That is, the first light-emitting element 220A is disposed opposite to the second light-emitting element 220B and the third light-emitting element 220C with the light reflective member as a boundary. Thus, because the distance between the first light-emitting element 220A and the second light-emitting element 220B as well as the third light-emitting element 220C is increased, even if the light-emitting elements serve as heat sources, the concentration of the heat sources can be suppressed.

In the top view, regions of the mounting surface divided into two by a virtual second straight line L2 passing along the first optical axis OA1 are referred to as a third region R3 and a fourth region R4. In such a case, the second light-emitting element 220B is disposed in the third region, and the third light-emitting element 220C is disposed in the fourth region R4. Thus, because the distance between the second light-emitting element 220B and the third light-emitting element 220C is increased, even if the light-emitting elements serve as heat sources, the concentration of the heat sources can be suppressed. In the top view, the second light-emitting element 220B and the third light-emitting element 220C may be line-symmetric relative to the second straight line L2.

In the example of the light emitting device 200 illustrated by the drawings, the first straight line L1 is a straight line extending in the first direction. In the description of the relationship with the first direction, the description in which the "first direction" is replaced with the "first straight line L1" is established for the relationship with the first straight line L1. The second straight line L2 is a straight line extending in the second direction. In the description of the relationship with the second direction, the description in which the "second direction" is replaced with the "second straight line L2" is established for the relationship with the second straight line L2.

In the top view, a virtual line passing through the first position P1 and parallel to the first direction passes through the second light reflective surface 242 and the third light reflective surface 243. In the top view, a virtual line passing through the second position P2 and parallel to the first direction passes through the first light reflective surface 241 and the third light reflective surface 243. In the top view, a virtual line passing through the third position P3 and parallel to the first direction passes through the first light reflective surface 241 and the second light reflective surface 242. By satisfying one or more of these conditions, a light reflective member can be disposed in a small region, which can contribute to the miniaturization of the light emitting device 200.

In a triangle connecting a light-emitting point (first light-emitting point) from which light passing along the first optical axis OA1 is emitted on the light-emitting surface of the first light-emitting element 220A, a light-emitting point (second light-emitting point) from which light passing along the second optical axis OA2 is emitted on the light-emitting surface of the second light-emitting element 220B, and a light-emitting point (third light-emitting point) from which light passing along the third optical axis OA3 is emitted on the light-emitting surface of the third light-emitting element 220C, an angle with the first light-emitting point as a corner is the largest. This triangle is an isosceles triangle in which an angle with the second light-emitting point as a corner is equal to an angle with the third light-emitting point as a corner. The expression "angles are equal" described here includes a tolerance of ±5°. By satisfying one or more of these conditions, a light-emitting element and a light reflective member can be disposed in a small region, which can contribute to the miniaturization of the light emitting device 200.

In the top view, a virtual straight line passing through the first light-emitting point and the first position P1 is referred to as a first optical axis line, a virtual straight line passing through the second light-emitting point and the second position P2 is referred to as a second optical axis line, and a virtual straight line passing through the third light-emitting point and the third position P3 is referred to as a third optical axis line.

The first light-emitting point of the first light-emitting element 220A is located in a region surrounded by the second optical axis line, the third optical axis line, and the first straight line L1 in the top view. In this region, the first position P1 is located. This region includes at least a part of the first light reflective surface 241. This region includes a part of the second light reflective surface 242 and a part of the third light reflective surface 243. By satisfying one or more of these conditions, a light-emitting element and a light reflective member can be disposed in a small region, which can contribute to the miniaturization of the light emitting device 200.

In the top view, the distance from the first light-emitting point to a point where a virtual straight line connecting the second light-emitting point and the third light-emitting point intersects the first optical axis line is preferably a magnification in a range from 1.5 times to 5 times the distance from the first light-emitting point to the first position P1. This magnification is more preferably in a range from 1.5 times to 3 times. By satisfying this condition, a light-emitting element and a light reflective member can be disposed in a small region, which can contribute to the miniaturization of the light emitting device 200.

In the top view, preferably, the distance from the first light-emitting point to the point where the virtual straight line connecting the second light-emitting point and the third light-emitting point intersects the first optical axis line is a magnification exceeding 1.0 times and a magnification of 2.0 times or less the length in the second direction of a light reflective surface having the longest length in the second direction among the first light reflective surface 241, the second light reflective surface 242, and the third light reflective surface 243. By satisfying this condition, a light-emitting element and a light reflective member can be disposed in a small region, which can contribute to the miniaturization of the light emitting device 200.

In the top view, the center of the mounting surface overlaps the first light reflective surface 241. The second light reflective surface 242 is disposed in the third region R3. The third light reflective surface 243 is disposed in the fourth region R4. In the top view, the second light reflective surface 242 and the third light reflective surface 243 may be line-symmetric relative to the second straight line L2. For example, in the top view, the first light reflective surface is disposed on the first straight line L1.

Light emitted from the first light-emitting element 220A and reflected by the first light reflective surface 241, light emitted from the second light-emitting element 220B and reflected by the second light reflective surface 242, and light emitted from the third light-emitting element 220C and reflected by the third light reflective surface 243 are close to one another. In the top view, the light beams are superimposed in a region overlapping the first light reflective surface 241. In the top view, the light beams are superimposed in a region overlapping the first position P1 and not overlapping the second position P2 and the third position P3.

In the top view, by the second light-emitting element 220B and the third light-emitting element 220C being line-symmetric relative to the second straight line L2 and the second light reflective surface 242 and the third light reflective surface 243 being line-symmetric relative to the second straight line L2, light beams emitted from the respective light-emitting elements can be efficiently superimposed.

For example, in the top view, light passing along the first optical axis OA1 coincides with a normal line N1 to the first light reflective surface 241 at the first position P1. That is, the light-emitting surface of the first light-emitting element 220A and the first light reflective surface 241 face each other from the front. For example, in the top view, an angle θ2 formed between light passing along the second optical axis OA2 and a normal line N2 to the second light reflective surface 242 at the second position P2 is an acute angle. That is, the light-emitting surface of the second light-emitting element 220B and the second light reflective surface 242 do not face each other from the front. For example, in the top view, an angle θ3 formed between light passing along the third optical axis OA3 and a normal line N3 to the third light reflective surface 243 at the third position P3 is an acute angle. That is, the light-emitting surface of the third light-emitting element 220C and the third light reflective surface 243 do not face each other from the front. θ2 is an angle until the normal line N2 rotates clockwise about the second position P2 and overlaps the second optical axis OA2 in the top view. θ3 is an angle until the normal line N3 rotates counterclockwise about the third position P3 and overlaps the third optical axis OA3 in the top view.

The first light-emitting element 220A, the second light-emitting element 220B, and the third light-emitting element 220C are electrically connected in series. A plurality of wiring regions are formed on the mounting surface. For example, the plurality of metal films 215 provided on the base member 210 serve as the plurality of wiring regions.

Figure 7:
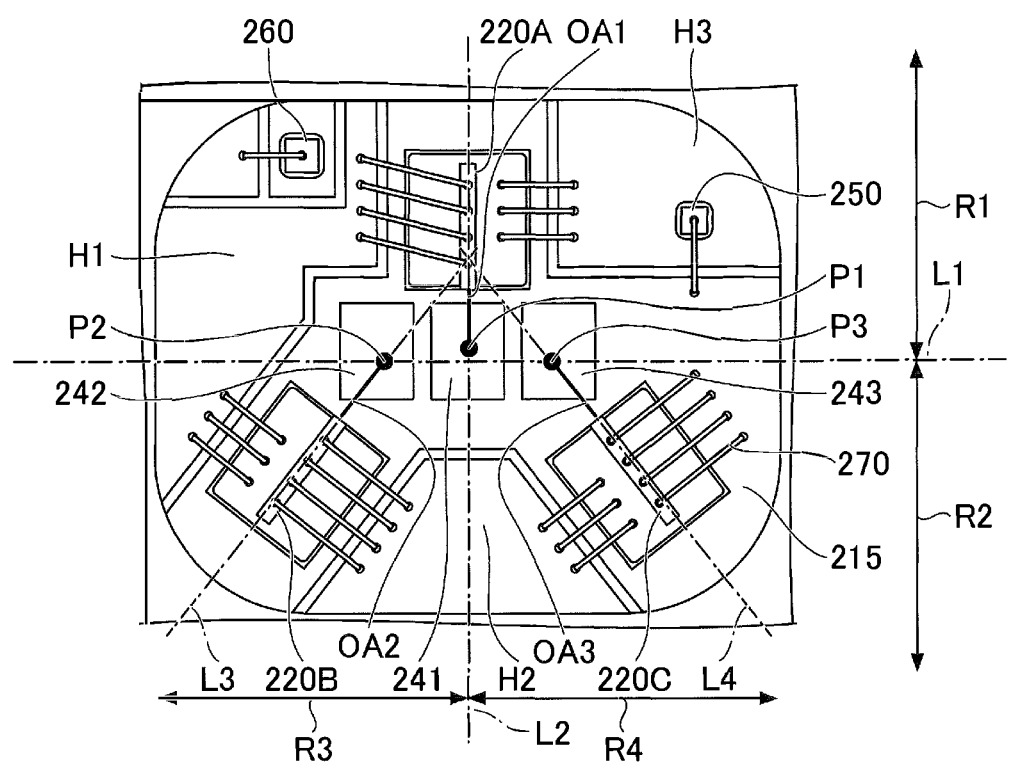
FIG. 7 is a partially enlarged top view (part 2) of the light emitting device according to the present embodiment from which the wavelength conversion member and the sealing member are removed.

As illustrated in FIG. 7, the plurality of wiring regions include a first wiring region H1 included in a current path between the first light-emitting element 220A and the second light-emitting element 220B, a second wiring region H2 included in a current path between the second light-emitting element 220B and the third light-emitting element 220C, and a third wiring region H3 included in a current path between the third light-emitting element 220C and the first light-emitting element 220A.

A part or the whole of the first wiring region H1 is formed in the first region R1 and the third region R3, in the top view. A part or the whole of the third wiring region H3 is formed in the first region R1 and the fourth region R4, in the top view.

In the top view, a part or the whole of the second wiring region H2 is formed in a region interposed between a virtual third straight line L3 passing along the second optical axis OA2 and a virtual fourth straight line L4 passing along the third optical axis OA3, in the second region R2. In the top view, the second straight line L2 passes through the second wiring region H2. At least one of the submount 230 in which the second light-emitting element 220B is disposed or the submount 230 in which the third light-emitting element 220C is disposed is not disposed in the second wiring region H2.

In the example illustrated in FIG. 7, the entire second wiring region H2 is formed in the region interposed between the third straight line L3 and the fourth straight line L4 in the second region R2, in the top view. Neither the submount 230 in which the second light-emitting element 220B is disposed nor the submount 230 in which the third light-emitting element 220C is disposed is disposed in the second wiring region H2. The second wiring region H2 is line-symmetric relative to the second straight line L2.

The protective element 250 and the temperature measuring element 260 are disposed on the bottom surface 210e of the base member 210. The protective element 250 is disposed on and bonded to the metal film 215 formed on the bottom surface 210e of the base member 210. The temperature measuring element 260 is disposed on and bonded to the metal film 215 formed on the bottom surface 210e of the base member 210.

The protective element 250 and the temperature measuring element 260 are preferably disposed in the first region R1. In a state in which each submount 230 and one or a plurality of light reflective members are disposed, because the first region R1 has a larger excess space for component placement than the second region R2, if components are disposed in the first region R1, the mounting surface can be efficiently used and the light emitting device 200 can be miniaturized.

Preferably, one of the protective elements 250 and the temperature measuring element 260 is disposed in the first region R1 and the third region R3, and the other of the protective elements 250 and the temperature measuring element 260 is disposed in the first region R1 and the fourth region R4. By disposing the protective elements 250 and the temperature measuring element 260 in this way, the mounting surface can be efficiently used and the light emitting device 200 can be miniaturized.

The submount 230 on which the light-emitting element 220 is disposed serves as a heat dissipation member that dissipates heat generated from the light-emitting element 220, in the light emitting device 200. In order to cause the submount 230 to serve as the heat dissipation member, the submount 230 may be made of a material having a higher thermal conductivity than the light-emitting element 220.

The submount 230 can serve to adjust a light-emitting position of light of the light-emitting element 220, in the light emitting device 200. As for the submount 230, for example, when light passing along the optical axis of the light-emitting element 220 is to be emitted parallel to the bottom surface 210e, the submount 230 can be used as an adjustment member. The parallel described here allows a tolerance within ±3°.

The light-emitting elements 220, the protective element 250, and the temperature measuring element 260 are electrically connected to the metal film 215 provided on the bottom surface 210e of the base member 210 via the corresponding wiring lines 270. The metal film 215 provided on the bottom surface 210e of the base member 210 is used for electrical connection between these elements and an external power source. Thus, these elements and the external power source can be electrically connected via the metal film 216 provided on the upper surface 210a of the base member 210 and electrically connected to the metal film 215 via the metal material provided in the via hole.

The sealing member 280 is disposed on the upper surface side of the base member 210. Specifically, the sealing member 280 is supported by the frame of the base member 210 and is disposed above the plurality of light-emitting elements 220 surrounded by the frame. The outer peripheral portion of the lower surface of the sealing member 280 is bonded to, for example, the upper surface of the step portion 212 of the base member 210. For example, a metal film provided on the outer peripheral portion of the lower surface of the sealing member 280 and a metal film provided on the upper surface of the step portion 212 are fixedly bonded together via Au—Sn or the like.

A closed space in which the light-emitting elements 220 are disposed is created by bonding the sealing member 280 to the base member 210. This closed space is created in a hermetically sealed state. The closed space is hermetically sealed, so that collection of dust such as organic substances on the light-emitting surface of the light-emitting element 220 can be suppressed. The sealing member 280 is bonded to the base member 210, for example, in a state in which the wavelength conversion member 290 is bonded to the upper surface of the sealing member 280.

Light emitted from the light-emitting element 220 passes through the sealing member 280. Specifically, the light emitted from the light-emitting element 220 is incident on the lower surface of the sealing member 280 after being reflected by the light reflective member, and then is emitted from the upper surface of the sealing member 280 through the sealing member 280. The sealing member 280 can also be referred to as a light transmissive member that transmits the light emitted from the light-emitting element 220.

The wavelength conversion member 290 is disposed on the upper surface of the sealing member 280. The wavelength conversion member 290 is, for example, smaller than the sealing member 280 in the top view. The upper surface of the wavelength conversion member 290 is located higher than the upper surface 210a of the base member 210, for example.

The wavelength conversion member 290 includes a light incident region where the main part of light is incident and a peripheral region of the light incident region. In the wavelength conversion member 290, the wavelength conversion portion 291 forms the light incident region. That is, light emitted from the first light-emitting element 220A and reflected by the first light reflective surface 241, light emitted from the second light-emitting element 220B and reflected by the second light reflective surface 242, and light emitted from the third light-emitting element 220C and reflected by the third light reflective surface 243 pass through the sealing member 280, and then are incident on the lower surface of the wavelength conversion portion 291 of the wavelength conversion member 290. With this configuration, the lower surface of the wavelength conversion portion 291 serves as an incident surface for light beams emitted from the plurality of light-emitting elements 220, and the upper surface of the wavelength conversion portion 291 serves as an emission surface for wavelength converted light or the light beams emitted from the plurality of light-emitting elements 220.

In the light emitting device 200, the wavelength conversion portion 291 overlaps at least a part of the first light reflective surface 241 in the top view. In the top view, the wavelength conversion portion 291 does not overlap each of the second light reflective surface 242 and the third light reflective surface 243. The wavelength conversion portion 291 may overlap at least a part of each of the second light reflective surface 242 and the third light reflective surface 243, in the top view. In the top view, the length of the wavelength conversion portion 291 along the first straight line L1 (see FIGS. 6 and 7) is shorter than the length, along the first straight line L1, of a region where the first light reflective surface 241, the second light reflective surface 242, and the third light reflective surface 243 are disposed. The length of the wavelength conversion portion 291 along the first straight line L1 may not be shorter than the length along the first straight line L1 of the region in the top view.

The wavelength conversion portion 291 emits second light obtained by converting first light emitted from the light-emitting element 220 into light having a different wavelength. The first light emitted from the light-emitting element 220 or the second light wavelength-converted by the wavelength conversion portion 291 is emitted from the upper surface of the wavelength conversion portion 291 to the outside of the light emitting device 200.

Figure 8:
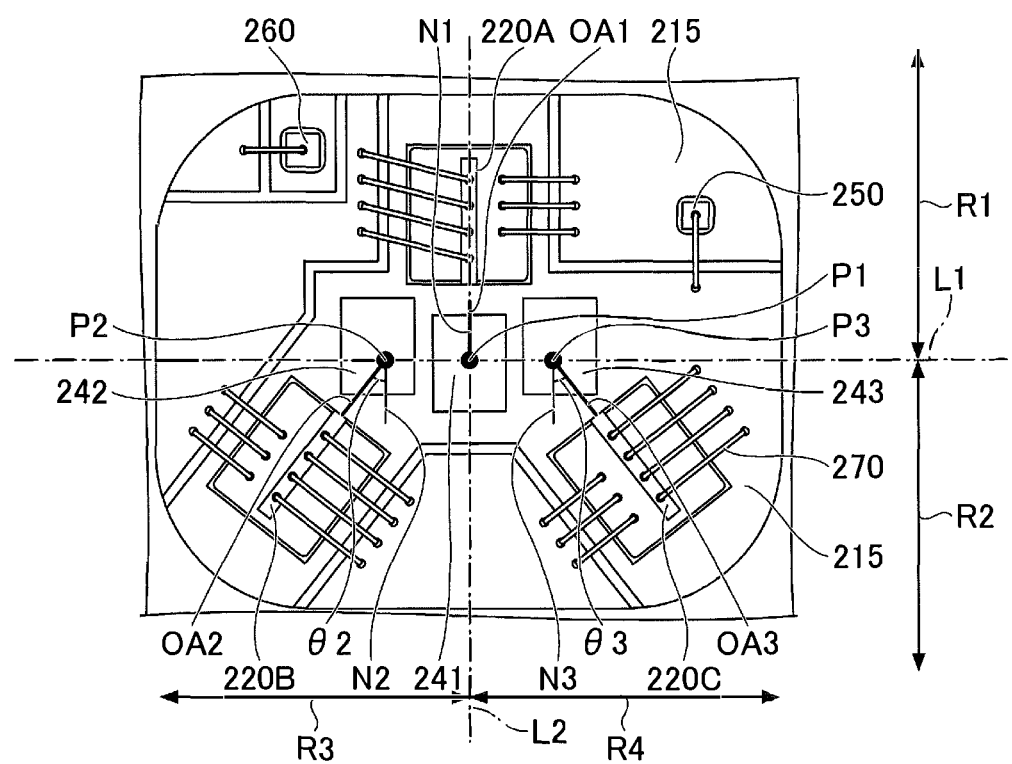
FIG. 8 is a partially enlarged top view (part 3) of the light emitting device according to the present embodiment from which the wavelength conversion member and the sealing member are removed.

As illustrated in FIG. 6, in the top view, the first position P1, the second position P2, and the third position P3 are not on a straight line. Specifically, the first position P1 is located closer to the first light-emitting element 220A than the first straight line L1. Thus, light beams emitted from the light emitting devices 200 and traveling along the optical axes can be suppressed from concentrating at one point on the lower surface of the wavelength conversion portion 291, and the distribution of the light beams can be dispersed. As illustrated in FIG. 8, in the top view, the first position P1, the second position P2, and the third position P3 may be disposed on a straight line.

In the light emitting device 200, a light extraction region is smaller than the mounting surface of the base member 210 in the top view. Among the plurality of light-emitting elements 220, a distance between two light-emitting elements 220 that are farthest apart in the top view is greater than a length of the light extraction region in a direction same as that of the distance.

For example, when the first light-emitting element 220A has a light emission peak wavelength corresponding to red light, the second light-emitting element 220B has a light emission peak wavelength corresponding to green light, and the third light-emitting element 220C has a light emission peak wavelength corresponding to blue light, the light emitting device 200 may not include the wavelength conversion member 290. In this case, the light emitting device 200 may be provided with a diffusion member that diffuses light, instead of the wavelength conversion member 290. For example, a portion with the wavelength conversion portion 291 becomes a diffusion portion that diffuses light. In this case, a portion with the light reflective portion 292 may become a light shielding portion that shields light. In other words, the light emitting device 200 may include a diffusion member 290 including a diffusion portion 291 and a light shielding portion 292. In the example of the light emitting device 200 illustrated by the drawings, the component of reference character 290 can be a wavelength conversion member or a diffusion member.

The light shielding member 300 is formed inside the frame formed by the upper surface 210a of the base member 210. The light shielding member 300 is formed so as to fill a gap between the base member 210 and the wavelength conversion member 290. The light shielding member 300 can be formed by, for example, pouring thermosetting resin and then curing the poured thermosetting resin with heat. By providing the light shielding member 300, leakage of light is suppressed.

Figure 9:
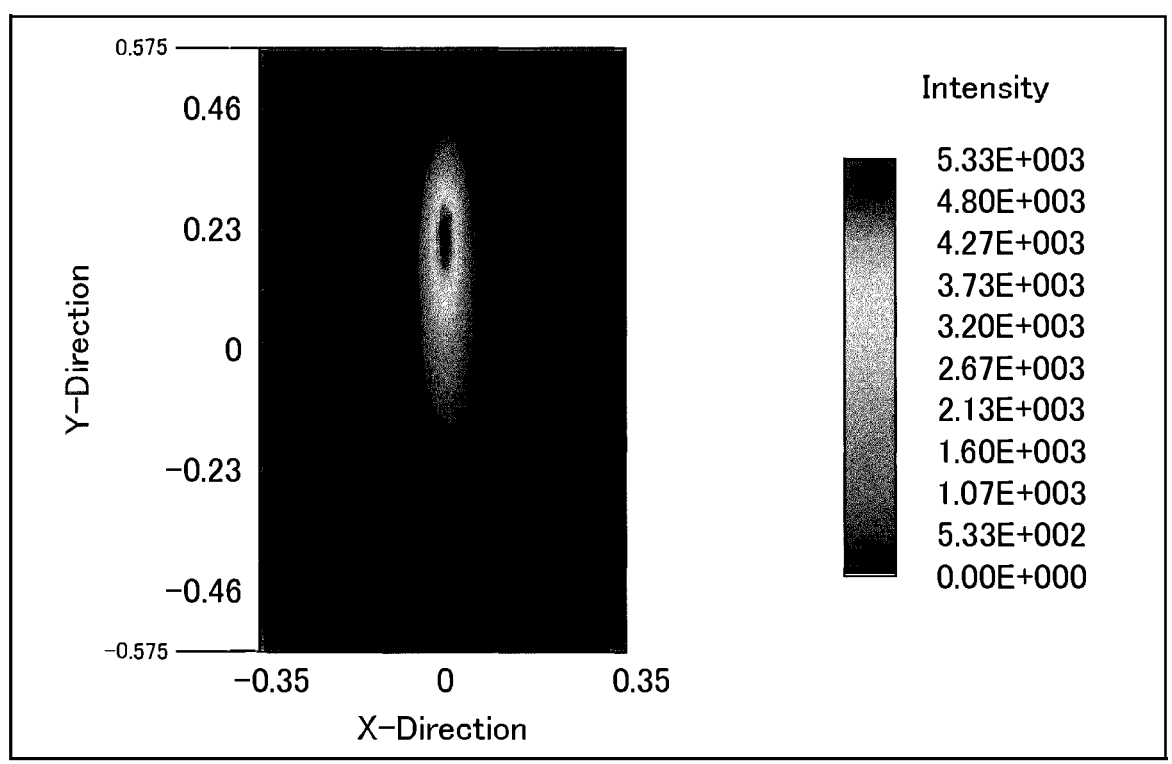
FIG. 9 is an image illustrating an intensity distribution of light incident on a first light reflective surface of the light emitting device according to the present embodiment.
Figure 10:
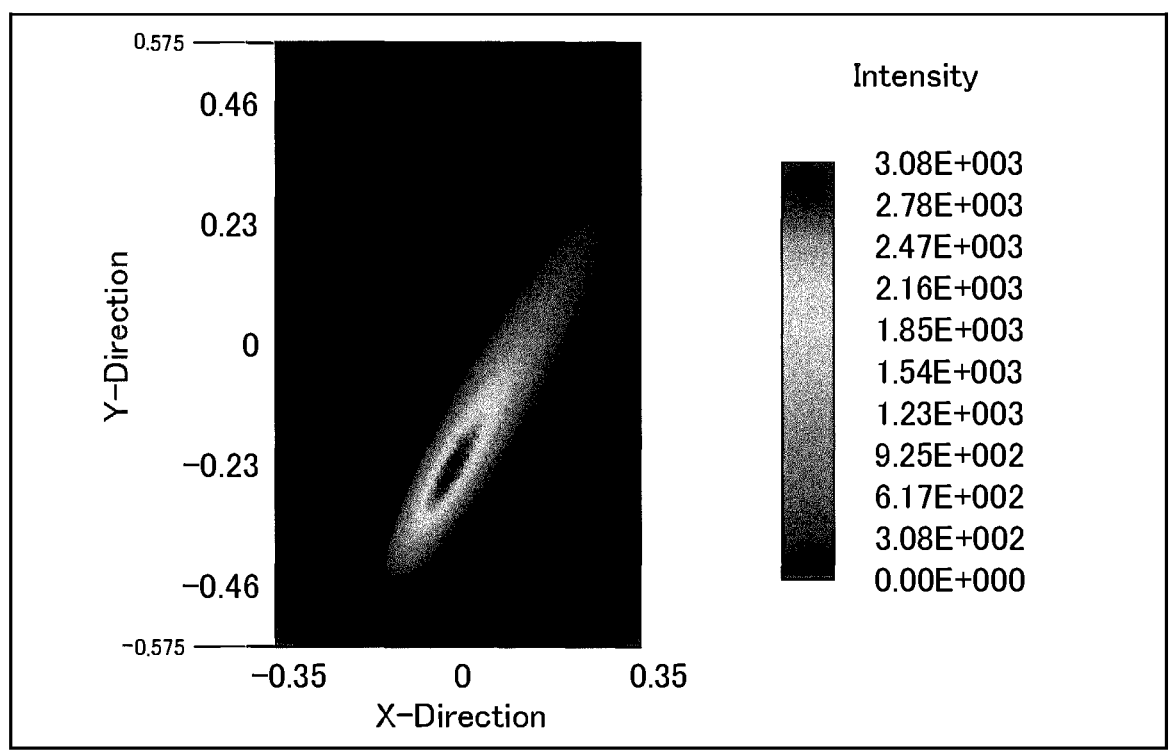
FIG. 10 is an image illustrating an intensity distribution of light incident on a second light reflective surface of the light emitting device according to the present embodiment.
Figure 11:
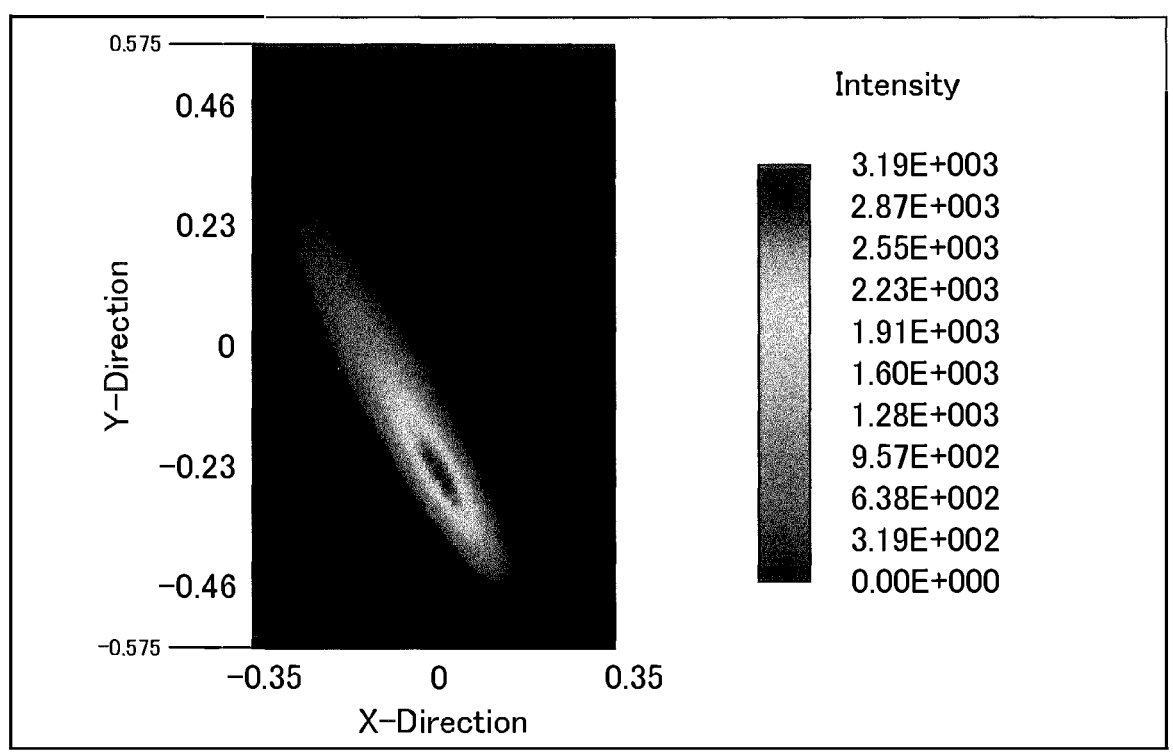
FIG. 11 is an image illustrating an intensity distribution of light incident on a third light reflective surface of the light emitting device according to the present embodiment.

FIG. 9 is an image representing an intensity distribution of light incident on the first light reflective surface of the light emitting device according to the present embodiment. FIG. 10 is an image representing an intensity distribution of light incident on the second light reflective surface of the light emitting device according to the present embodiment. FIG. 11 is an image representing an intensity distribution of light incident on the third light reflective surface of the light emitting device according to the present embodiment. The first light-emitting element 220A, the second light-emitting element 220B, and the third light-emitting element 220C are semiconductor laser elements.

In FIGS. 9 to 11, X-Direction indicates coordinate values in the direction of the first straight line L1 in FIGS. 6 and 7, and Y-Direction indicates coordinate values in the direction of the second straight line L2 in FIGS. 6 and 7. In the images of FIGS. 9 to 11, both a high light intensity portion and a low light intensity portion are black due to monochrome processing, but the black at the center of light of elliptical FFP indicates the high light intensity portion and the black at the periphery of the light of FFP indicates the low light intensity portion.

As illustrated in FIG. 9, the major axis direction of the elliptical FFP of light emitted from the first light-emitting element 220A is approximately in the direction of the second straight line L2 in FIGS. 6 and 7. On the other hand, as illustrated in FIG. 10, the major axis direction of the elliptical FFP of light emitted from the second light-emitting element 220B is oblique to the direction of the second straight line L2 of FIGS. 6 and 7. As illustrated in FIG. 11, the major axis direction of the elliptical FFP of light emitted from the third light-emitting element 220C is oblique to the direction of the second straight line L2 of FIGS. 6 and 7. The major axis direction of the elliptical FFP in FIG. 10 and the major axis direction of the elliptical FFP in FIG. 11 are approximately line-symmetric relative to the second straight line L2.

In the light emitting device 200, light beams emitted from the plurality of light-emitting elements 220 and reflected by the corresponding light reflective surfaces approach each other and enter the light extraction region of the light emitting device 200, and three light beams are superimposed on the light incident surface of the wavelength conversion member 290. That is, on an incident surface of the light extraction region, the light beams from the plurality of light-emitting elements 220 are aligned parallel to each other in a plan view parallel to the incident surface. For example, when the plurality of light-emitting elements 220 are semiconductor laser elements, this relationship is established in the major axis direction or the minor axis direction of the elliptical FFP. The parallel described here includes a tolerance of ±5°.

Regarding discretionary two light-emitting elements 220 selected from the plurality of light-emitting elements 220, light emitted from each light-emitting element 220 includes light irradiated on a specific point on any one of light reflective surfaces. The light irradiated on the specific point is incident on a specific point on the incident surface of the light extraction region. In this case, the distance between two points on the incident surface of the light extraction region is smaller than the distance between two points on the corresponding light reflective surfaces. The magnitude relationship between the distance between the two points on the light reflective surface and the distance between the two points in the light extraction region is established at any irradiation point where the main part of light is irradiated.

Light beams, which are emitted from the plurality of light-emitting elements 220 with the same light-emitting shape (for example, FFP in the case of a semiconductor laser element) of light emitted from the light-emitting surface, can be superimposed at a high rate on the light incident surface of the light extraction region. By making the light-emitting shapes of the lights emitted from the plurality of light-emitting elements 220 the same, for example, 50% or more of the main part of each of the light beams can be superimposed, and even 80% or more of the main part of each of the light beams can be superimposed. The rate described here can be determined on the basis of an area of the light-emitting shape of the FFP.

With this configuration, the light emitting device 200 includes at least three light-emitting elements (the first light-emitting element 220A, the second light-emitting element 220B, and the third light-emitting element 220C), so that the luminance of light emitted from the light emitting device 200 can be increased.

Each light-emitting element is considered to be a heat source, but in the light emitting device 200, the first light-emitting element 220A is disposed opposite to the second light-emitting element 220B and the third light-emitting element 220C with the light reflective member as a boundary, so that the plurality of light-emitting elements serving as heat sources are disposed in a distributed manner. Thus, the distance between the light-emitting elements is increased, and even if the light-emitting elements serve as heat sources, the concentration of the heat sources can be suppressed, thereby reducing the possibility that the light emission efficiency of the light-emitting elements is lowered or the light-emitting elements are broken down.

Figure 12:
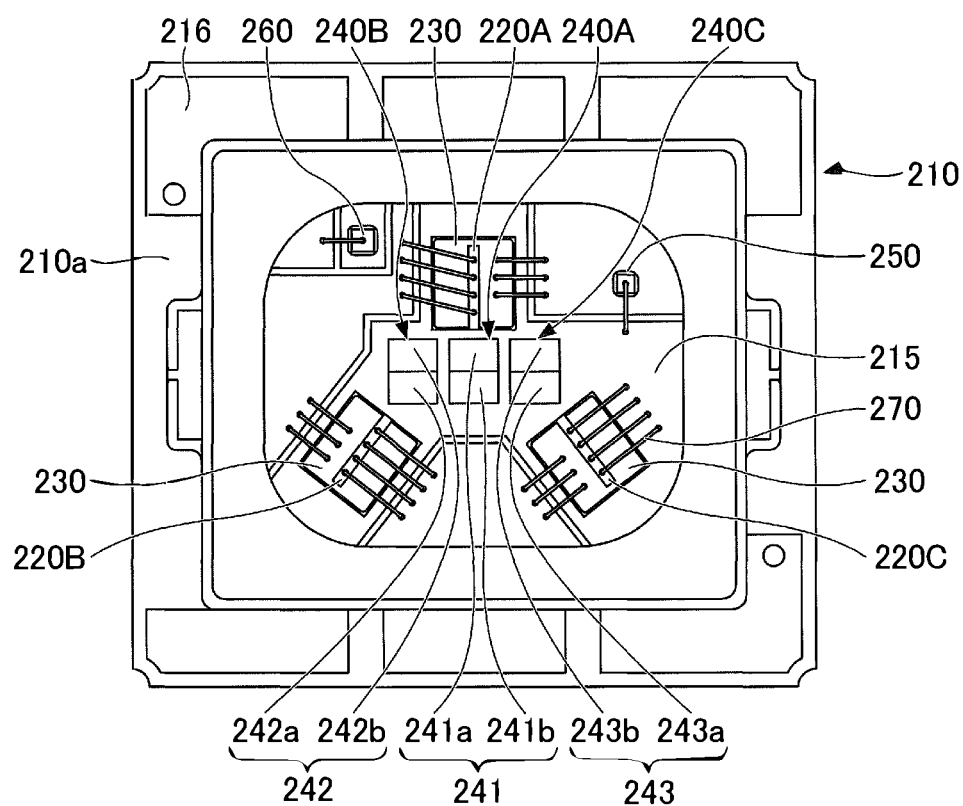
FIG. 12 is a diagram illustrating a variation of a light reflective surface.

FIG. 12 is a schematic diagram illustrating a variation of the light reflective surface. As illustrated in FIG. 12, each light reflective surface may be configured from a plurality of regions. In FIG. 12, the first light reflective surface 241 includes a first reflective region 241a, and a second reflective region 241b located farther away from the first light-emitting element 220A than the first reflective region 241a. The inclination angle of the second reflective region 241b relative to the lower surface of the first light reflective member 240A is greater than the inclination angle of the first reflective region 241a relative to the lower surface of the first light reflective member 240A.

The first reflective region 241a and the second reflective region 241b are formed so that light reflected by a portion of the first reflective region 241a closer to the second reflective region 241b out of light reflected by the first reflective region 241a and light reflected by a portion of the second reflective region 241b closer to the first reflective region 241a out of light reflected by the second reflective region 241b intersect each other before reaching the incident surface of the wavelength conversion member 290 and irradiates both ends of the incident surface of the wavelength conversion member 290.

For example, by a portion having a relatively high light intensity of light reflected by the first reflective region 241a and a portion having a relatively high light intensity of light reflected by the second reflective region 241b being intersected in the course of an optical path to avoid superimposition on the incident surface of the wavelength conversion member 290, the light intensity at both ends in the longer direction of the incident surface of the wavelength conversion member 290 can be made higher than the light intensity at the center thereof. The first reflective region 241a and the second reflective region 241b may be provided so that the incident surface of the wavelength conversion member 290 is irradiated with light having a uniform light intensity. Even in this case, a certain effect can be obtained as compared to a light emitting device having a high light intensity at the center thereof in the related art.

The first reflective region 241a and the second reflective region 241b are provided to change only the light intensity distribution in the longer direction of elliptical-shaped light irradiated to the first light reflective member 240A. That is, the first reflective region 241a and the second reflective region 241b are provided so that the light intensity distribution in the longer direction of the elliptical-shaped light is not too high at the center of the elliptical-shaped light without changing the light intensity distribution in a shorter direction of the elliptical-shaped light. This results from the fact that the FFP of the first light-emitting element 220A easily spreads particularly in the longer direction of the elliptical-shaped light, and a greater effect can be obtained by controlling the light intensity distribution in the longer direction of the elliptical-shaped light.

The first reflective region 241a and the second reflective region 241b are planes. That is, the light reflective surface of the first light reflective member 240A includes two planes. This not only facilitates design of the first light reflective member 240A but also applies a margin for a permissible range of displacement occurring during being mounted. Because the first reflective region 241a and the second reflective region 241b are planes, it becomes easier to form the first light reflective member 240A. The light reflective surface includes two planes but may include three or more planes. When the light intensity at both ends of the incident surface of the wavelength conversion member 290 is made higher than the light intensity at the center thereof, the light reflective surface includes an even number of planes. Each of the first reflective region 241a and the second reflective region 241b may be curved.

The first light reflective surface 241 has been described above, and similarly, the second light reflective surface 242 includes a first reflective region 242a, and a second reflective region 242b located farther away from the second light-emitting element 220B than the first reflective region 242a. The third light reflective surface 243 includes a first reflective region 243a, and a second reflective region 243b located farther away from the third light-emitting element 220C than the first reflective region 243a. The technical significance of configuring each of the second light reflective surface 242 and the third light reflective surface 243 by using a plurality of regions is the same as in the case of the first light reflective surface 241.

The light emitting device 200 can be used, for example, for an on-vehicle headlight. The light emitting device 200 is not limited to the above and can be used for illumination, a projector, a head-mounted display, and a light source such as a backlight of other displays.

Although the preferred embodiments and the like have been described in detail above, the disclosure is not limited to the above-described embodiments and the like, and various changes and substitutions can be made to the above-described embodiments and the like without departing from the scope described in the claims.

This international application claims priority based on Japanese Patent Application No. 2020-215688 filed on Dec. 24, 2020, and the entire contents of Japanese Patent Application No. 2020-215688 are incorporated into this international application.

REFERENCE SIGNS LIST

200 Light emitting device
210 Base member
210a Upper surface
210b Lower surface
210c Inner lateral surface
210d Outer lateral surface
210e Bottom surface
212 Step portion
215, 216 Metal film
220A First light-emitting element 220B Second light-emitting element
220C Third light-emitting element
230 Submount
240A First light reflective member
240B Second light reflective member
240C Third light reflective member
241 First light reflective surface
241a, 242a, 243a First reflective region
241b, 242b, 243b Second reflective region
242 Second light reflective surface
243 Third light reflective surface
250 Protective element
260 Temperature measuring element
270 Wiring line
280 Sealing member
290 Wavelength conversion member
291 Wavelength conversion portion
292 Light reflective portion
300 Light shielding member

The invention claimed is:

1. A light emitting device comprising:
a base member having a mounting surface;
a first light-emitting element disposed on the mounting surface and configured to emit light passing along a first optical axis;
a second light-emitting element disposed on the mounting surface and configured to emit light passing along a second optical axis;
a third light-emitting element disposed on the mounting surface and configured to emit light passing along a third optical axis; and
one or more light reflective members having a first light reflective surface, a second light reflective surface, and a third light reflective surface, the first light reflective surface including a first position to be irradiated with the light passing along the first optical axis and being inclined relative to the mounting surface, the second light reflective surface including a second position to be irradiated with the light passing along the second optical axis and being inclined relative to the mounting surface, the third light reflective surface including a third position to be irradiated with the light passing along the third optical axis and being inclined relative to the mounting surface, wherein:
in a top view, when the mounting surface is divided into a first region and a second region by a virtual first straight line passing through the second position and the third position as a boundary, the first light-emitting element is disposed in the first region, and the second light-emitting element and the third light-emitting element are disposed in the second region,
in the top view, the second light reflective surface and the third light reflective surface sandwich the first light reflective surface,
in the top view, the light passing along the first optical axis coincides with a normal line to the first light reflective surface at the first position,
in the top view, the light passing along the second optical axis and a normal line to the second light reflective surface at the second position form an acute angle, and
in the top view, the light passing along the third optical axis and a normal line to the third light reflective surface at the third position form an acute angle.

2. The light emitting device according to claim 1, wherein in the top view, when the mounting surface is divided into a third region and a fourth region by a virtual second straight line passing along the first optical axis as a boundary, the second light-emitting element is disposed in the third region and the third light-emitting element is disposed in the fourth region.

3. The light emitting device according to claim 2, wherein in the top view, the second light-emitting element and the third light-emitting element are line-symmetric relative to the second straight line.

4. The light emitting device according to claim 2, wherein in the top view, a center of the mounting surface overlaps the first light reflective surface, the second light reflective surface is disposed in the third region, and the third light reflective surface is disposed in the fourth region.

5. The light emitting device according to claim 2, wherein in the top view, the second light reflective surface and the third light reflective surface are line-symmetric relative to the second straight line.

6. The light emitting device according to claim 1, wherein in the top view, the first light reflective surface is disposed on the virtual first straight line.

7. The light emitting device according to claim 6, wherein in the top view, the first position, the second position, and the third position are disposed on a straight line.

8. The light emitting device according to claim 1, wherein the second light reflective surface and the third light reflective surface are located on a virtual first plane, and the first light reflective surface is located on a virtual second plane not coplanar with the virtual first plane.

9. The light emitting device according to claim 1, wherein light from the first light-emitting element reflected by the first light reflective surface, light from the second light-emitting element reflected by the second light reflective surface, and light from the third light-emitting element reflected by the third light reflective surface approach one another, and are superimposed in a region overlapping the first position and not overlapping the second position and the third position in the top view.

10. The light emitting device according to claim 1, further comprising:
a wavelength conversion member where light from the first light-emitting element reflected by the first light reflective surface, light from the second light-emitting element reflected by the second light reflective surface, and light from the third light-emitting element reflected by the third light reflective surface enter.

11. The light emitting device according to claim 1, wherein:
the first light-emitting element, the second light-emitting element, and the third light-emitting element are electrically connected in series,
a plurality of wiring regions including a first wiring region included in a current path between the first light-emitting element and the second light-emitting element, a second wiring region included in a current path between the second light-emitting element and the third light-emitting element, and a third wiring region included in a current path between the third light-emitting element and the first light-emitting element, are formed on the mounting surface, and
in the top view, a part or a whole of the second wiring region is formed in a region, in the second region, sandwiched between a virtual third straight line passing along the second optical axis and a virtual fourth straight line passing along the third optical axis.

12. The light emitting device according to claim 1, further comprising:
a temperature measuring element disposed on the mounting surface in the first region; and a protective element disposed on the mounting surface in the first region.

13. A light emitting device comprising:
a base member having a mounting surface;
a first light-emitting element disposed on the mounting surface and configured to emit light passing along a first optical axis;
a second light-emitting element disposed on the mounting surface and configured to emit light passing along a second optical axis;
a third light-emitting element disposed on the mounting surface and configured to emit light passing along a third optical axis; and
one or more light reflective members having a first light reflective surface, a second light reflective surface, and a third light reflective surface, the first light reflective surface including a first position to be irradiated with the light passing along the first optical axis and being inclined relative to the mounting surface, the second light reflective surface including a second position to be irradiated with the light passing along the second optical axis and being inclined relative to the mounting surface, the third light reflective surface including a third position to be irradiated with the light passing along the third optical axis and being inclined relative to the mounting surface, wherein:
in a top view, when the mounting surface is divided into a first region and a second region by a virtual first straight line passing through the second position and the third position as a boundary, the first light-emitting element is disposed in the first region, and the second light-emitting element and the third light-emitting element are disposed in the second region,
in the top view, the second light reflective surface and the third light reflective surface sandwich the first light reflective surface, and
light from the first light-emitting element reflected by the first light reflective surface, light from the second light-emitting element reflected by the second light reflective surface, and light from the third light-emitting element reflected by the third light reflective surface approach one another, and are superimposed in a region overlapping the first position and not overlapping the second position and the third position in the top view.

14. A light emitting device comprising:
a base member having a mounting surface;
a first light-emitting element disposed on the mounting surface and configured to emit light passing along a first optical axis;
a second light-emitting element disposed on the mounting surface and configured to emit light passing along a second optical axis;
a third light-emitting element disposed on the mounting surface and configured to emit light passing along a third optical axis; and
one or more light reflective members having a first light reflective surface, a second light reflective surface, and a third light reflective surface, the first light reflective surface including a first position to be irradiated with the light passing along the first optical axis and being inclined relative to the mounting surface, the second light reflective surface including a second position to be irradiated with the light passing along the second optical axis and being inclined relative to the mounting surface, the third light reflective surface including a third position to be irradiated with the light passing along the third optical axis and being inclined relative to the mounting surface, wherein:
in a top view, when the mounting surface is divided into a first region and a second region by a virtual first straight line passing through the second position and the third position as a boundary, the first light-emitting element is disposed in the first region, and the second light-emitting element and the third light-emitting element are disposed in the second region,
in the top view, the second light reflective surface and the third light reflective surface sandwich the first light reflective surface,
the first light-emitting element, the second light-emitting element, and the third light-emitting element are electrically connected in series,
a plurality of wiring regions including a first wiring region included in a current path between the first light-emitting element and the second light-emitting element, a second wiring region included in a current path between the second light-emitting element and the third light-emitting element, and a third wiring region included in a current path between the third light-emitting element and the first light-emitting element, are formed on the mounting surface, and
in the top view, a part or a whole of the second wiring region is formed in a region, in the second region, sandwiched between a virtual third straight line passing along the second optical axis and a virtual fourth straight line passing along the third optical axis.

* * * * *